US010673545B1

(12) United States Patent
Kurvathodil et al.

(10) Patent No.: US 10,673,545 B1
(45) Date of Patent: Jun. 2, 2020

(54) NOISE MEASUREMENT FOR INTEGRATED CIRCUIT DEVICE WITH ON-DEVICE TEST SIGNAL UP-CONVERSION

(71) Applicant: Infineon Technologies AG, Neubiberg (DE)

(72) Inventors: Manoj Kurvathodil, Linz (AT); Thomas Obermueller, Linz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/381,565

(22) Filed: Apr. 11, 2019

(51) Int. Cl.
  H04B 3/46 (2015.01)
  H04B 17/00 (2015.01)
  H04Q 1/20 (2006.01)
  H04B 17/29 (2015.01)
  G01S 7/40 (2006.01)
  G01R 31/28 (2006.01)
  H04B 17/21 (2015.01)

(52) U.S. Cl.
  CPC ......... *H04B 17/29* (2015.01); *G01R 31/2822* (2013.01); *G01S 7/4021* (2013.01); *H04B 17/21* (2015.01)

(58) Field of Classification Search
  CPC ...... H04B 17/29; H04B 17/21; H04B 17/345; G01S 7/4021; G01S 7/032; G01R 31/2822; G01R 29/26; H03G 1/0088; H03G 3/007
  USPC ........................................ 375/227, 224, 228
  See application file for complete search history.

(56) References Cited

U.S. PATENT DOCUMENTS

| 3,794,999 | A  | * | 2/1974  | Gellekink | G01R 29/26 342/168 |
| 6,871,050 | B2 | * | 3/2005  | Wahl      | H03G 3/007 375/345 |
| 7,492,313 | B1 | * | 2/2009  | Ehret     | G01S 7/032 342/158 |
| 2005/0267716 | A1 | * | 12/2005 | Largey | H04B 17/345 702/191 |
| 2007/0105517 | A1 | * | 5/2007  | Chang  | H03G 1/0088 455/249.1 |

(Continued)

OTHER PUBLICATIONS

Keysight Technolgies; Noise Figure Measurement Accuracy: The Y-Factor Method; Application Note; Dec. 1, 2017.

(Continued)

*Primary Examiner* — Phuong Phu
(74) *Attorney, Agent, or Firm* — Eschweiler & Potashnik, LLC

(57) ABSTRACT

Noise test systems, methods, and circuitries are provided for determining a noise characteristic of a receiver. In one example, an integrated circuit device includes an active RF receiver element configured to process a radio frequency (RF) signal to generate a receiver signal; an up-conversion mixer configured to up-convert a test signal to generate an RF test signal; an attenuator configured to selectively adjust a power of the RF test signal to generate adjusted RF test signals; and a coupler configured to couple the adjusted RF test signals to an input of the active RF receiver element. In another example, instead of or in addition to the attenuator, the integrated circuit device includes first, second, and third power sensors configured to measure a power of the test signal, the RF test signal, and the receiver signal, respectively. The power measurements are used to determine the noise characteristic.

22 Claims, 4 Drawing Sheets

(56) References Cited

U.S. PATENT DOCUMENTS

2016/0077196 A1 3/2016 Dehlink et al.
2016/0381649 A1* 12/2016 Anthony .............. H04B 1/0057
　　　　　　　　　　　　　　　　　　　　455/127.2

OTHER PUBLICATIONS

Rota, Franco; Noise Source Diodes, I2FHW, VHF Communications; Jan. 2007.

* cited by examiner

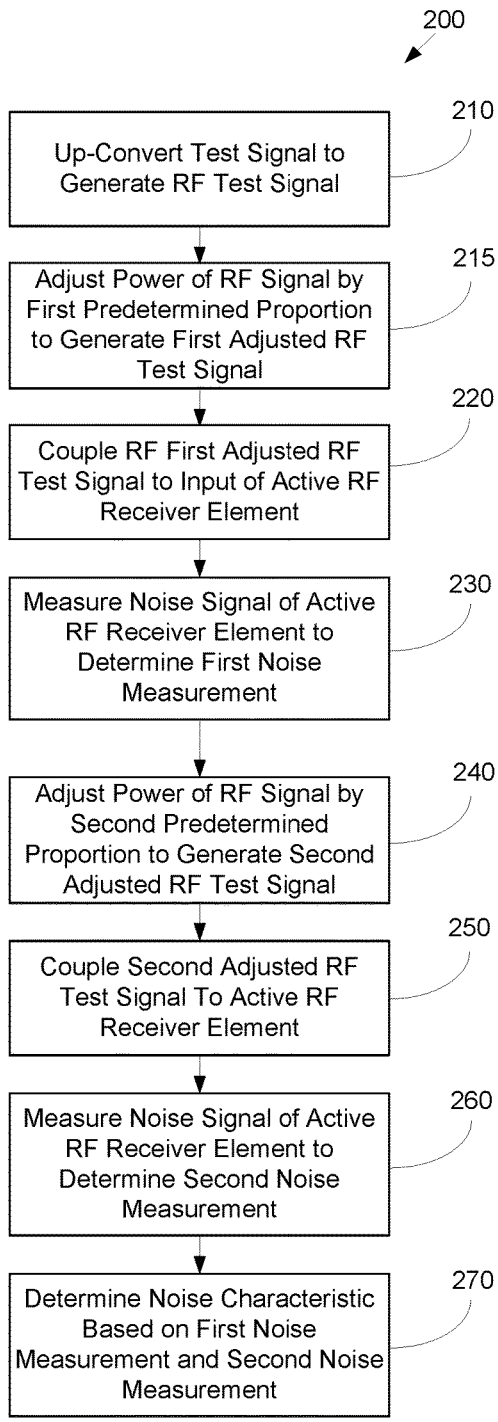
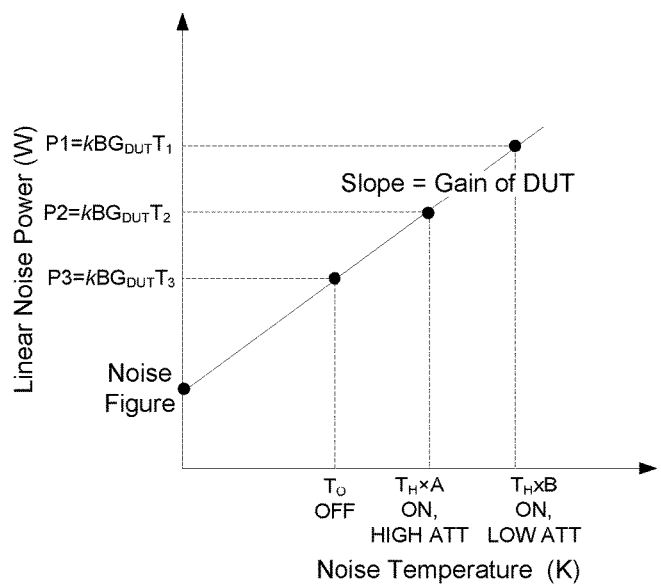
FIG. 2A
FIG. 2

NOISE MEASUREMENT FOR INTEGRATED CIRCUIT DEVICE WITH ON-DEVICE TEST SIGNAL UP-CONVERSION

BACKGROUND

Noise figure is an important performance parameter in many radio frequency (RF) systems. A low noise figure provides an improved signal/noise ratio for analog receivers and reduces the bit error rate in digital receivers. A receiver having a low noise figure can perform at the same performance level with smaller antennas or lower transmitter power than a receiver with a higher noise figure.

BRIEF DESCRIPTION OF THE DRAWINGS

FIG. 2 illustrates an exemplary flow diagram of an exemplary method of performing a noise test on a receiver in accordance with various aspects described.

FIG. 2A illustrates a plot depicting a relationship between noise temperature and linear noise power.

DESCRIPTION

Figure 1:
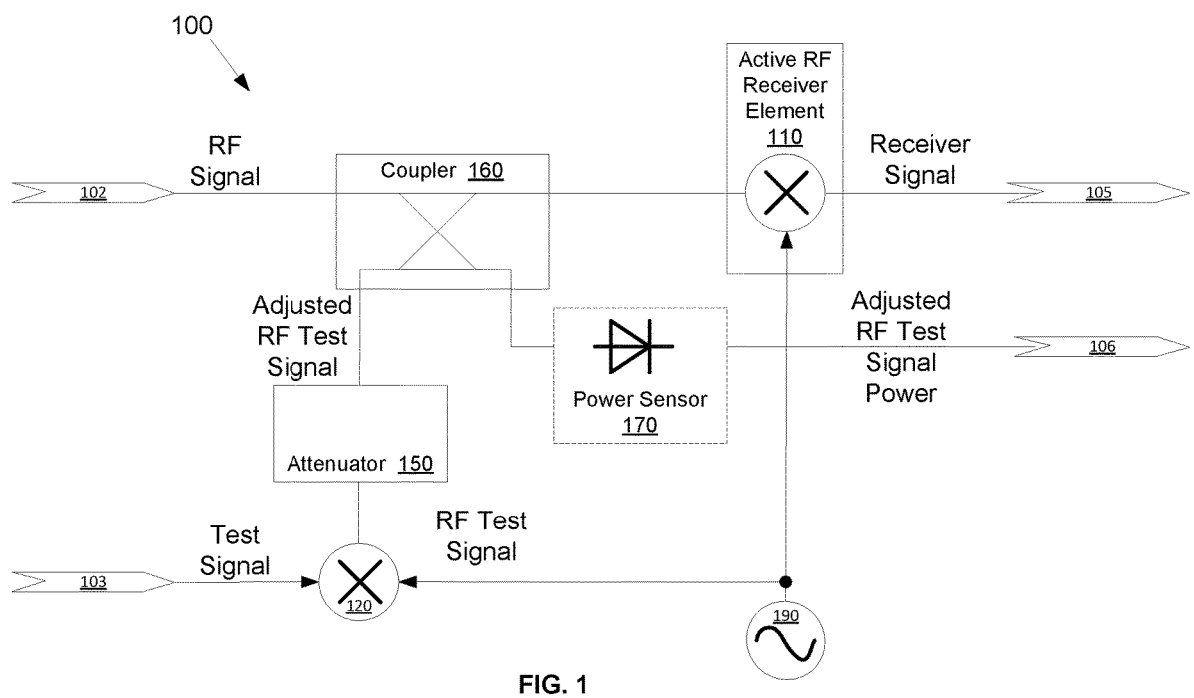
FIG. 1 illustrates an exemplary receiver that includes a noise test system in accordance with various aspects described.

Noise figure is one important parameter that is defined for RADAR and other RF receivers. The noise figure describes the noise degradation of the signal-to-noise ratio (SNR) through a device. Noise figure is typically defined as the (logarithmic) ratio of input SNR to output SNR at a standardized temperature, T=T0, designated by IEEE to be 290K($\approx$−17° C.). The noise figure of receivers is tested during the wafer testing stage of integrated circuit device manufacturing. The industry standard for the noise figure measurement is the Y factor testing method, which utilizes an external (e.g., off-chip/wafer) calibrated noise source with a defined excess noise ratio (ENR) in the operating range of the device under test (DUT). In a Y factor test, the DUT is connected to the calibrated noise source (or test signal source) and two measurements are performed on the noise signal output by the DUT. A first noise signal measurement is performed with a noise source being in an ON state and a second noise measurement is performed with the noise source being in an OFF state (reduced noise power). The noise source ON state and the noise source OFF state are herein referred to as ON state and OFF state, respectively. The noise figure is then calculated based on a ratio of the first noise signal measurement and the second noise signal measurement.

As the operating frequency of receivers increase into the millimeter (mm) wave range (30-300 GHz), performing the Y factor method test on receivers embodied in a wafer becomes difficult. This is because conventional automated wafer testing equipment includes noise sources having a defined ENR only into the X band (8 GHz-12 GHz). Even if higher frequency noise sources were available, the handling of mm wave signals on test hardware is challenging, including the likelihood of signal corruption in transitioning from the automated test equipment (ATE) to the DUT.

Due to these difficulties in employing the Y factor testing method on mm wave receivers, a cold noise or gain testing method may be used to test mm wave receivers. In the cold noise method, rather than using an external noise source, the gain of the DUT is determined using an internally generated test signal. Then the "cold" output noise power density of the DUT is measured (with the input of the DUT terminated with a characteristic impedance). The noise figure of the DUT can be calculated based on the gain and the measured cold noise power density. The cold noise method has significant drawbacks including the difficulty of determining the gain of the DUT which involves measuring the amplitude of the internally generated test signal using an on-chip peak voltage detector which is susceptible to process variation. This leads to inaccuracies in the gain estimation and the noise figure of the DUT.

Described herein are systems, circuitries, and methods that measure a noise characteristic of a DUT by up-converting an external test signal on-chip to the operating range of the DUT. This on-chip up-conversion allows for Y method based testing to be performed on mm wave receivers using lower frequency conventional external noise sources. The described systems, circuitry, and methods enable the noise introduced by this on-chip up-conversion to be separated from the noise generated by the DUT so that the noise characteristic of the DUT may be accurately determined.

Throughout this description, the term "noise characteristic" of a device is used to broadly encompass any standard expression that describes the degradation to the SNR of a signal caused by the processing of the signal by the device. The different noise characteristics are typically related to one another mathematically, meaning that one noise characteristic can be derived from another noise characteristic. Examples of noise characteristics include the noise figure and the noise factor (which are related to one another by a logarithmic function) and the noise temperature. When certain aspects are described in terms of noise figure, it is to be understood that other noise characteristics (including those not listed here) can be determined using the described systems, circuitry, and methods.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring to the transmit signal in baseband, intermediate, and radio frequencies.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates an exemplary receiver 100 that is embodied on as an integrated circuit device on a chip. The receiver 100 includes an RF input port 102 and a test input port 103 that are configured to receive signals from sources external to the chip. The receiver 100 includes a down-converted signal output port 105 and an optional test signal power output port 106 that are configured to provide signals to off-chip devices. The receiver 100 includes an active RF receiver element that processes an RF signal received on port 102 to generate a receiver signal that is output on port 105. The receiver signal may have a baseband (BB) or intermediate frequency (IF) that is lower than the RF frequency (i.e., the receiver signal is a downconverted RF signal). The receiver signal is provided to off-chip baseband processing components. For the purposes of the following description, the active RF receiver element will be described in some instances as a down-conversion mixer that down-converts the RF signal to generate a receiver signal. However, it is to be understood that the active RF receiver element may be any active receiver component such as, for example, mixers or amplifiers.

The receiver 100 includes an on-chip noise test system configured to measure a noise characteristic of the active RF receiver element 110. The test system includes an up-conversion mixer 120, an adjustable attenuator 150, and a coupler 160. The up-conversion mixer 120 is configured to up-convert a test signal to the operating RF frequency of the receiver 100 to generate an RF test signal. The test signal source (not shown) is capable of operating in a noise mode or a calibration signal mode. When the test signal source is in the calibration signal mode, the test signal may be predetermined periodic signal. When the test signal source is in noise mode, the test signal is a noise signal as described above with reference to the Y test method. The attenuator 150 selectively adjusts a power level of the RF test signal to at least two different levels to generate adjusted RF test signals.

The coupler 160 couples the adjusted RF test signal to an input of the active RF receiver element 110. In one example, the coupler 160 is a directional coupler. Measurements of the noise signal (e.g., the receiver signal) generated by the active RF receiver element 110 in response to the adjusted RF test signal may be taken at the port 106. As will be described in more detail with reference to FIGS. 2 and 2A, the use of the attenuator 150 to selectively attenuate the RF test signal facilitates separating the noise effects of the up-conversion mixer 120 from the overall noise characteristic of the receiver 100.

In some examples, the attenuator 150 may be operable between a first mode in which the RF test signal is decreased by some first fixed predetermined proportion and an OFF mode in which the power of the RF test signal is decreased by a further second fixed predetermined proportion different from the first fixed predetermined proportion. In one example, the attenuator 150 may be operable between an ON mode in which the power of the RF test signal is decreased by some fixed predetermined proportion and an OFF mode in which the power of the RF test signal is not appreciably decreased or can be considered as being un-attenuated.

Each predetermined proportion is a relative power level with respect to the un-attenuated power level of the RF test signal (e.g., when the attenuator is OFF). Thus each predetermined proportion may be considered as a percentage or fraction of the RF test signal power. In some examples, the attenuator 150 is capable of adjusting the RF test signal power to more than just two levels (e.g., up to 10 different settings in one example). As will be discussed with reference to FIG. 2A, having additional attenuation settings/proportions improves the accuracy of the noise characteristic measurement.

In one example, the attenuator 150 may include a resistor bank that includes a short circuit path and is configured to provide at least two different levels of resistance. In this example when the attenuator is ON, some predetermined subset of the resistors are connected in series between the up-conversion mixer 110 and the coupler 160. When the attenuator is OFF the short circuit path is connected in series between the up-conversion mixer 110 and the coupler 160. When multiple predetermined proportions are used, several different subsets of resistors may be used to achieve the different levels of attenuation. In another example, the attenuator 150 may include an amplifier with multiple amplifier stages that amplify the RF test signal. In this example, when the attenuator is ON some predetermined number of stages are deactivated and when the attenuator is OFF all of the stages are activated. In addition to these examples, the attenuator may include any circuit or collection of electronic components that together function to selectively attenuate the RF test signal.

The attenuator 150 may be subject to process variations and thus the amount of attenuation provided by the attenuator 150 may vary from device to device. As such the level of attenuation imposed on an RF signal by a given attenuator 150 may be measured. One way to determine the predetermined proportion is to determine a power of the down-converted signal with the attenuator 150 being in a first attenuation state (e.g., ON) and also determine the power of the down-converted signal with the attenuator 150 being in a second attenuation state (e.g., OFF). While this method is effective, it includes fairly processor-intensive analysis of the down-converted signals to determine the power of each signal.

To facilitate determining the predetermined proportion for a given attenuator, a power sensor 170 that directly measures the power of the adjusted RF test signal may be included in the test system. In one example, the power sensor 170 is a diode-based peak-voltage sensor that measures a power of the adjusted RF test signal. To determine the predetermined proportion of attenuation imposed on the RF test signal by the attenuator 150, the test signal is a predetermined periodic (e.g., sinusoidal) calibration signal that is input to the up-conversion mixer 120. The power of the adjusted up-converted calibration signal as measured by the power sensor 170 is output on port 106. This allows the predetermined proportion to be more readily calculated as a ratio of two DC voltages, one voltage representing the adjusted up-converted calibration signal power with the attenuator 150 ON and the other voltage representing the adjusted up-converted calibration signal power with the attenuator 150 OFF.

An on-chip local oscillator (LO) circuit 190 generates an RF LO signal that is used to down-convert the RF signal and also to up-convert the test signal. The use of an on-chip LO circuit 190 means that the LO circuit 190 may be subject to similar process variations as the active RF receiver element 110 and the up-conversion mixer 120 meaning that the LO circuit 190 will have similar noise contributions (e.g., thermal, flicker noise, and so on). Thus the noise contribution of the LO circuit may be neglected due to the use of ratio measurements in the described noise testing techniques.

Further, the on-chip LO circuit 190 eliminates the need for calibration of external sources for the LO signal and also does away with the need to handle such high frequency signals in the external test system. In one example the LO circuit 190 includes an adjustable oscillator (e.g., voltage controlled oscillator) that is synchronized with a reference clock signal using a phase-locked loop (PLL).

FIG. 2 illustrates a flow diagram outlining an exemplary method 200 to determine a noise characteristic of the active RF receiver element 110 of FIG. 1. The method includes, at 210, up-converting a test signal (e.g., with on-chip up-conversion mixer 120 of FIG. 1) to generate an RF test signal. Recall that the test signal may be a noise signal from an external calibrated noise source. At 215, the power of the RF test signal is adjusted by a first predetermined proportion to generate a first adjusted RF test signal. At 220, the first adjusted RF test signal is coupled to an input of the active RF receiver element (e.g., using coupler 160 of FIG. 1). Note that in one example the first predetermined proportion is zero, meaning that the RF test signal is un-attenuated and the attenuator 150 of FIG. 1 is OFF. At 230, the noise signal that the active RF receiver element 110 generates in response to the RF test signal is measured (e.g., at port 105) to determine a first noise measurement (P1 in FIG. 2A). When the RF test (noise) signal is un-attenuated, the first measurement is a "hot" power measurement.

At 240, the method includes adjusting a power of the RF test signal by a second predetermined proportion to generate a second adjusted RF test signal. The attenuation may be performed using the attenuator 150 of FIG. 1. At 250 the second adjusted RF test signal is coupled to the input of the active RF receiver element and at 260, the noise signal generated by the active RF receiver element is measured to determine a second noise measurement (P2 in FIG. 2A) based on the second adjusted RF test signal. At 270, the method includes determining the noise characteristic based on the first noise measurement and the second noise measurement.

FIG. 2A, which illustrates the relationship between linear noise power (e.g., the noise measurements taken at port 105) and noise temperature (which is a function of noise test system component settings). The noise temperature can be deduced from the power measurement by dividing the power measurement by the product $kBG_{DUT}$, where k is the Boltzmann constant and B is the bandwidth of interest, and $G_{DUT}$ is the gain of the DUT. The noise measurements made during the noise test can be plotted as a function of noise temperature and a best fit line can be determined. The Y intercept of this best fit line is the noise figure for the DUT and the slope of the best fit line is the gain of the DUT. The first noise measurement P1 is taken at noise temperature $T_H$ in which the noise source is ON and the attenuator is providing a first predetermined proportion B of attenuation (or B=0 to achieve a hot noise temperature). The second noise measurement P2 is taken at noise temperature $T_H \times A$ in which the noise signal is attenuated by a higher predetermined proportion A. It can be seen that using the two data points yielded by measurements P1 and P2, the gain of the DUT (e.g., the active RF receiver element 110 of FIG. 1) can be determined based on a difference between the first noise measurement P1 and the second noise measurement P2 divided by the predetermined proportion A.

A third measurement P3 may be performed by removing the test signal from the up-conversion mixer and measuring a noise signal generated by the active RF receiver element to determine a third noise measurement. In one example, an input of the up-conversion mixer is terminated with a predetermined impedance (e.g. a 50 ohm or characteristic impedance) prior to making the third noise measurement. Because the noise source is OFF this is a cold measurement of the DUT that measures noise temperature $T_3$. The noise figure of the DUT (e.g., the y-intercept of the best fit line) can be determined based on the third noise measurement divided by a product of a standard noise temperature (T0) and the gain of the active RF receiver element.

In some examples, n additional noise measurements at n different predetermined proportions are taken to provide additional adjusted RF test signals data points to improve the quality of the best fit line used to determine the noise figure and gain of the DUT. In one example up to ten different attenuation levels are used. In one example, several different attenuation levels are used to determine an initial noise figure and then, in a subsequent noise test iteration, fewer attenuation levels are used to confirm or make adjustments to the initial noise figure. It is to be noted that the noise power is adjusted to the different levels during the measurements only by the different level settings of the attenuator 150, which is an internal component. This allows use of an externally generated test signal, without any adjusting of the strength of the externally generated test signal. As shown in FIG. 2A, the measurement results are expected to lie on a straight line. Thus by fitting a line using the obtained measurements, the noise figure can be determined.

Figure 3:
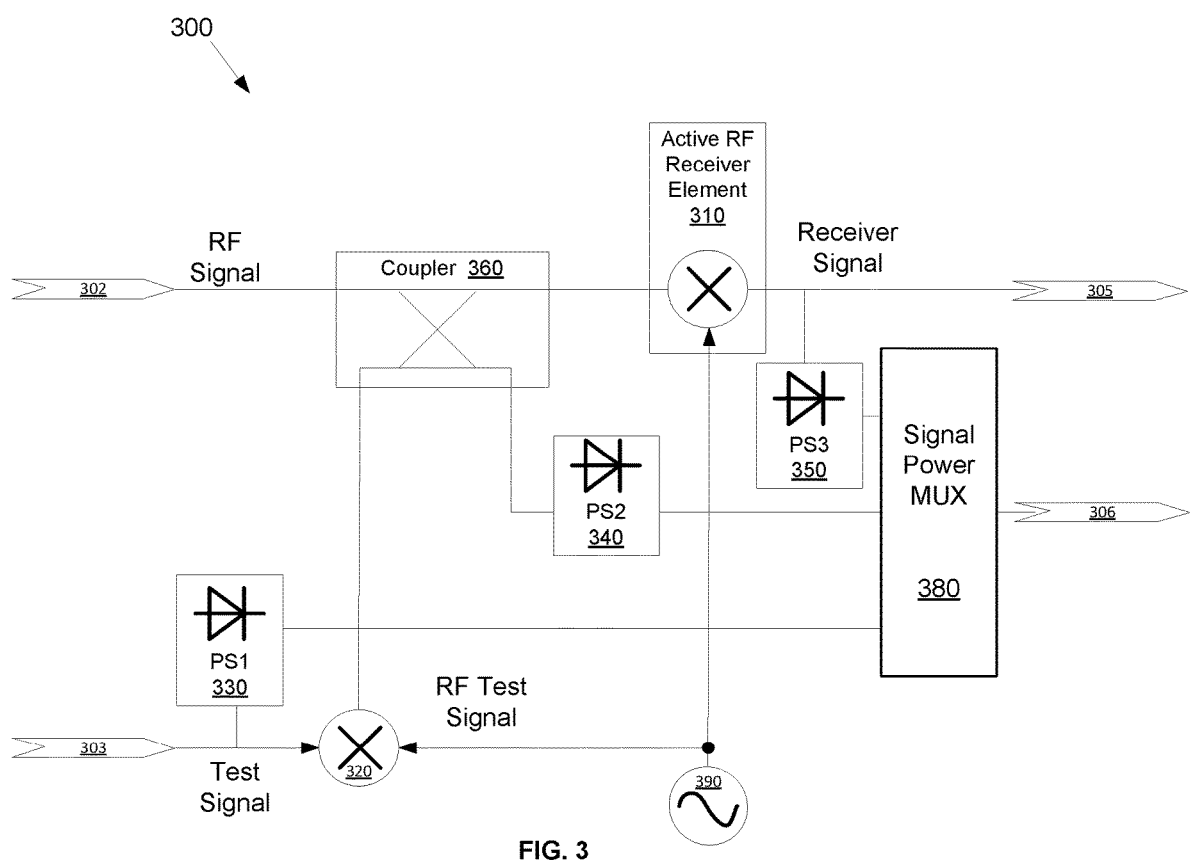
FIG. 3 illustrates an exemplary receiver that includes another noise test system in accordance with various aspects described.

FIG. 3 illustrates an exemplary receiver 300 that is embodied as an integrated circuit device on a chip. The receiver 300 includes an RF input port 302 and a test input port 303 that are configured to receive signals from sources external to the chip. The receiver 300 includes a down-converted signal output port 305 and an optional test signal power output port 306 that are configured to provide signals to off-chip devices. The receiver 300 includes an active RF receiver element 310 (e.g., a mixer or amplifier) that processes an RF signal received on port 302 to generate a receiver signal that is output on port 305. The receiver signal may have a baseband (BB) or intermediate frequency (IF) that is lower than the RF frequency. The receiver signal is provided to off-chip baseband processing components.

The receiver 300 includes an on-chip noise test system configured to measure a noise characteristic of the active RF receiver element 310. The test system includes an up-conversion mixer 320, a coupler 360, and three power sensors 330, 340, 350. In one example, the power sensors are diode-based peak-voltage sensors that measure a power of a signal. A signal power multiplexer 380 selects which power sensor's power measurement is output for analysis. The up-conversion mixer 320 is configured to up-convert a test signal to the operating RF frequency of the receiver 300 to generate an RF test signal. The test signal is a noise signal that is generated by a calibrated noise source as described above with reference to the Y test method. The coupler 360 couples the RF test signal to an input of the active RF receiver element 310. In one example, the coupler 360 is a directional coupler. Measurements of the noise signal (e.g., the receiver signal) generated by the active RF receiver element 310 in response to the RF test signal may be taken at the port 306.

The three power sensors 330, 340, 350 provide direct power measurements of the test signal, the RF test signal, and the receiver signal, respectively, to facilitate separating the noise effects of the up-conversion mixer 320 from the overall noise characteristic of the receiver 300. For example, the ratio between the measurement made by PS2 340 and PS1 330 can be used to estimate the gain of the up-conversion mixer 320 and a ratio between the measurement made by PS3 350 and PS2 340 can be used to estimate the gain of the active RF receiver element 310. Once the gain of the DUT (e.g., active RF receiver element 310) is estimated, a cold measurement (e.g., with input to up-conversion mixer 320 terminated with a characteristic impedance) can be made and the noise figure of the DUT can be determined as shown in FIG. 2A by fitting a linear line to the measurement results or other methods.

During an initial calibration of the power sensors, the ENR of the noise signal received from the off-chip calibrated noise source is measured with PS1 330 and a correlation between the PS1 power measurement and the known noise strength is made. Since all three power sensors are on-chip and subject to the same process variations, any power sensor errors compensate each other. Further, power sensor errors are negated by the fact that only ratios of power sensor readings are used for the gain estimation.

Figure 4:
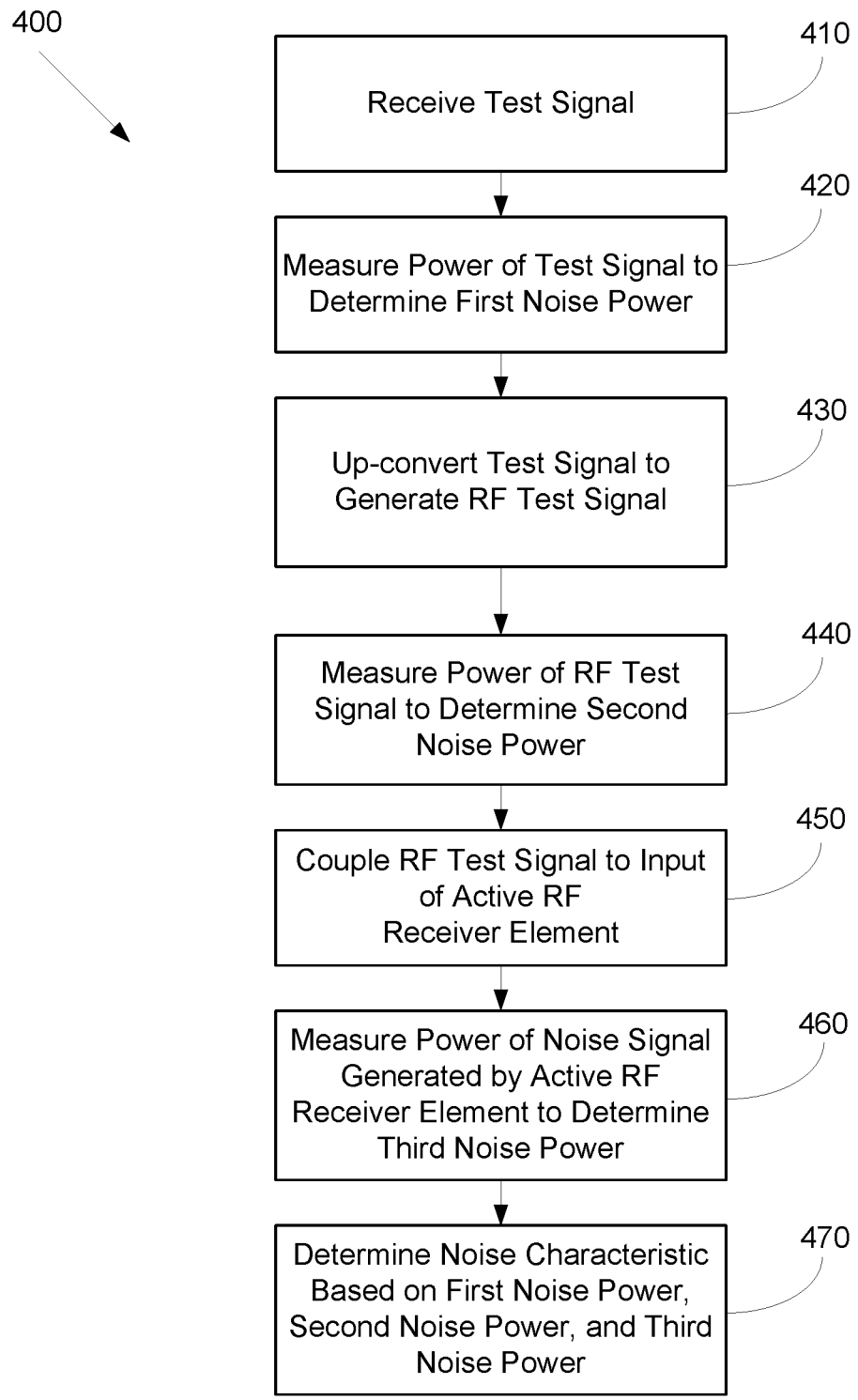
FIG. 4 illustrates an exemplary flow diagram of another exemplary method of performing a noise test on a receiver in accordance with various aspects described.

FIG. 4 illustrates a flow diagram outlining a method to determine a noise characteristic for an integrated circuit device that includes an active RF receiver element (e.g., active RF receiver element 310). The method includes, at 410, receiving a test signal (e.g., on test input port 303). At 420 a power of the test signal is measured (e.g., using PS1 330) to determine a first noise power. The method includes up-converting the test signal (e.g., using up-conversion mixer 320) to generate an RF test signal. At 430 the method includes measuring a power of the RF test signal (e.g., using PS2 340) to determine a second noise power at 440. The RF test signal is coupled to an input of the active RF receiver element at 450 and at 460 a power of a signal generated by the active RF receiver element is measured (e.g., using PS3 350) to determine a third noise power. At 470, the method includes determining the noise characteristic based on the first noise power, the second noise power, and the third noise power. The method may also include determining a gain of the active RF receiver element based on a ratio of the third noise power and the second noise power.

The noise characteristic may be determined based on the determined gain and a cold noise measurement. To perform the cold measurement, the test signal is removed from the up-conversion mixer and the signal generated by the active RF receiver element is measured. In one example, the input of the up-conversion mixer is terminated with a predetermined impedance (e.g., 50 ohms) prior to measuring the noise signal. The noise characteristic of the DUT may be determined based on the cold noise measurement divided by a product of a standard noise temperature and the gain of the active RF receiver element.

The method 400 and noise test system 300 provide the benefits of using direct power measurements (e.g., DC power of the various signals output by the power sensors) to determine the noise characteristic. This replaces time-consuming RF measurements and complex calculations with simple voltage measurements and ratios of voltages.

It can be seen from the foregoing description that the noise test systems, methods, and circuitries described herein support determining a noise characteristic using on-chip up-conversion of a noise signal from a calibrated noise source. The described systems, methods, and circuitries allow the noise contribution of the on-chip up-conversion to be isolated from the noise characteristic of the DUT. This eliminates the need to generate and propagate high-frequency (mm wave) test signals off-chip.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for noise determination according to embodiments and examples described herein.

Example 1 is an integrated circuit device including an active RF receiver element configured to process a radio frequency (RF) signal to generate a receiver signal; an up-conversion mixer configured to up-convert a test signal to generate an RF test signal; an attenuator configured to selectively adjust a power of the RF test signal to at least two different levels to generate adjusted RF test signals; and a coupler configured to couple the adjusted RF test signals to an input of the active RF receiver element.

Example 2 includes the subject matter of example 1, including or omitting optional elements, wherein the attenuator includes a resistor bank configured to exhibit at least two different levels of resistance.

Example 3 includes the subject matter of example 1, including or omitting optional elements, wherein the attenuator includes multiple amplifier stages configured to amplify the RF test signal by at least two different levels.

Example 4 includes the subject matter of example 1, including or omitting optional elements, further including a power sensor configured to measure a power of the adjusted test signal.

Example 5 includes the subject matter of example 1, including or omitting optional elements, further including a local oscillator circuit configured to generate an LO signal that is used to down-convert the RF signal and up-convert the test signal.

Example 6 includes the subject matter of example 1, including or omitting optional elements, wherein the integrated circuit device is implemented on a chip and the up-conversion mixer is configured to receive the test signal from a test signal source external to the chip.

Example 7 includes the subject matter of example 1, including or omitting optional elements, wherein the active RF receiver element includes a mixer.

Example 8 includes the subject matter of example 1, including or omitting optional elements, wherein the active RF receiver element includes an amplifier.

Example 9 is a method to determine a noise characteristic for an integrated circuit device including an active RF receiver element. The method includes up-converting a test signal to generate an RF test signal; adjusting a power of the RF test signal by a first predetermined proportion to generate a first adjusted RF test signal; coupling the first adjusted RF test signal to an input of the active RF receiver element; measuring a noise signal generated by the active RF receiver element to determine a first noise measurement based on the first adjusted RF test signal; adjusting a power of the RF test signal by a second predetermined proportion to generate a second adjusted RF test signal; coupling the second adjusted RF test signal to the input of the active RF receiver element; measuring the noise signal generated by the active RF receiver element to determine a second noise measurement based on the second adjusted RF test signal; and determining the noise characteristic based on the first noise measurement and the second noise measurement.

Example 10 includes the subject matter of example 9, including or omitting optional elements, further including determining a gain of the active RF receiver element based on a difference between the first noise measurement and the second noise measurement divided by the predetermined proportion.

Example 11 includes the subject matter of example 10, including or omitting optional elements, further including removing the test signal from an up-conversion mixer that generates the RF test signal; measuring a noise signal generated by the active RF receiver element to determine a third noise measurement; and determining the noise characteristic based on the third noise measurement.

Example 12 includes the subject matter of example 11, including or omitting optional elements, further including terminating an input of the up-conversion mixer with a predetermined impedance prior to measuring the noise signal.

Example 13 includes the subject matter of example 1, including or omitting optional elements, including determining the noise characteristic based on the third noise measurement divided by a product of a standard noise temperature and the gain of the active RF receiver element.

Example 14 includes the subject matter of example 9, including or omitting optional elements, further including determining n additional noise measurements by, in each of n subsequent iterations, adjusting the RF test signal by a different predetermined proportion to generate a different adjusted RF test signal; coupling the different adjusted RF test signal to an input of the active RF receiver element; and measuring the noise signal generated by the active RF receiver element to determine a respective noise measurement based on the different adjusted RF test signal; and determining the noise characteristic based on the first noise measurement, the second noise measurement, and the n additional noise measurements.

Example 15 includes the subject matter of example 14, including or omitting optional elements, wherein n is between 0 and 8.

Example 16 includes the subject matter of example 9, including or omitting optional elements, further including providing a calibration signal to an up-conversion mixer that generates the RF test signal; adjusting a power the up-converted calibration signal by the first predetermined proportion to generate a first adjusted up-converted calibration signal; measuring a power of the first adjusted up-converted calibration signal; adjusting a power the up-converted calibration signal by the second predetermined proportion to generate a second adjusted up-converted calibration signal; measuring a power of the second adjusted up-converted calibration signal; and determining the predetermined proportion based on a ratio between the power of the second adjusted up-converted calibration signal and the power of the first up-converted calibration signal.

Example 17 includes the subject matter of example 16, including or omitting optional elements, wherein the calibration signal includes a predetermined periodic signal.

Example 18 includes the subject matter of example 9, including or omitting optional elements, wherein the test signal includes a noise signal generated by a calibrated noise source.

Example 19 is an integrated circuit device including an active RF receiver element configured to process a radio frequency (RF) signal to generate a receiver signal; an up-conversion mixer configured to up-convert a test signal to generate an RF test signal; a first power sensor configured to measure a power of the test signal to determine a first noise power; a second power sensor configured to measure a power of the RF test signal to determine a second noise power; a coupler configured to couple the RF test signal to an input of the active RF receiver element; and a third power sensor configured to measure a power of the receiver signal to determine a third noise power.

Example 20 includes the subject matter of example 19, including or omitting optional elements, further including a local oscillator circuit configured to generate an LO signal that is used to up-convert the test signal and down-convert the RF signal.

Example 21 is a method to determine a noise characteristic for an integrated circuit device including an active RF receiver element, including receiving a test signal; measuring a power of the test signal to determine a first noise power; up-converting the test signal to generate an RF test signal; measuring a power of the RF test signal to determine a second noise power; coupling the RF test signal to an input of the active RF receiver element; measuring a power of a signal generated by the active RF receiver element to determine a third noise power; and determining the noise characteristic based on the first noise power, the second noise power, and the third noise power.

Example 22 includes the subject matter of example 21, including or omitting optional elements, further including determining a gain of the active RF receiver element based on a ratio of the third noise power and the second noise power.

Example 23 includes the subject matter of example 22, including or omitting optional elements, further including removing the test signal from an up-conversion mixer that up-converts the test signal; measuring the signal generated by the active RF receiver element to determine a noise measurement; and determining the noise characteristic based on the noise measurement.

Example 24 includes the subject matter of example 23, including or omitting optional elements, including determining the noise characteristic based on the noise measurement divided by a product of a standard noise temperature and the gain of the active RF receiver element.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. An integrated circuit device comprising:
   an active RF receiver element configured to process a radio frequency (RF) signal to generate a receiver signal;
   an up-conversion mixer configured to up-convert a test signal to generate an RF test signal;
   an attenuator configured to selectively adjust a power of the RF test signal to at least two different levels to generate adjusted RF test signals;
   a local oscillator circuit configured to generate an LO signal that is used to down-convert the RF signal and up-convert the test signal; and
   a coupler configured to couple the adjusted RF test signals to an input of the active RF receiver element.

2. The integrated circuit device of claim 1, wherein the attenuator comprises a resistor bank configured to exhibit at least two different levels of resistance.

3. The integrated circuit device of claim 1, wherein the attenuator comprises multiple amplifier stages configured to amplify the RF test signal by at least two different levels.

4. The integrated circuit device of claim 1, further comprising a power sensor configured to measure a power of the adjusted test signal.

5. The integrated circuit device of claim 1, wherein:
   the integrated circuit device is implemented on a chip; and
   the up-conversion mixer is configured to receive the test signal from a test signal source external to the chip.

6. The integrated circuit device of claim 1, wherein the active RF receiver element comprises a mixer.

7. The integrated circuit device of claim 1, wherein the active RF receiver element comprises an amplifier.

8. A method to determine a noise characteristic for an integrated circuit device comprising an active RF receiver element, the method comprising:
- up-converting a test signal to generate an RF test signal;
- adjusting a power of the RF test signal by a first predetermined proportion to generate a first adjusted RF test signal;
- coupling the first adjusted RF test signal to an input of the active RF receiver element;
- measuring a noise signal generated by the active RF receiver element to determine a first noise measurement based on the first adjusted RF test signal;
- adjusting a power of the RF test signal by a second predetermined proportion to generate a second adjusted RF test signal;
- coupling the second adjusted RF test signal to the input of the active RF receiver element;
- measuring the noise signal generated by the active RF receiver element to determine a second noise measurement based on the second adjusted RF test signal; and
- determining the noise characteristic based on the first noise measurement and the second noise measurement.

9. The method of claim 8, further comprising determining a gain of the active RF receiver element based on a difference between the first noise measurement and the second noise measurement divided by the predetermined proportion.

10. The method of claim 9, further comprising:
- removing the test signal from an up-conversion mixer that generates the RF test signal;
- measuring a noise signal generated by the active RF receiver element to determine a third noise measurement; and
- determining the noise characteristic based on the third noise measurement.

11. The method of claim 10, further comprising terminating an input of the up-conversion mixer with a predetermined impedance prior to measuring the noise signal.

12. The method of claim 10, comprising determining the noise characteristic based on the third noise measurement divided by a product of a standard noise temperature and the gain of the active RF receiver element.

13. The method of claim 8, further comprising determining n additional noise measurements by:
- in each of n subsequent iterations:
  - adjusting the RF test signal by a different predetermined proportion to generate a different adjusted RF test signal;
  - coupling the different adjusted RF test signal to an input of the active RF receiver element; and
  - measuring the noise signal generated by the active RF receiver element to determine a respective noise measurement based on the different adjusted RF test signal; and
- determining the noise characteristic based on the first noise measurement, the second noise measurement, and the n additional noise measurements.

14. The method of claim 13, wherein n is between 0 and 8.

15. The method of claim 8, further comprising:
- providing a calibration signal to an up-conversion mixer that generates the RF test signal;
- adjusting a power the up-converted calibration signal by the first predetermined proportion to generate a first adjusted up-converted calibration signal;
- measuring a power of the first adjusted up-converted calibration signal;
- adjusting a power the up-converted calibration signal by the second predetermined proportion to generate a second adjusted up-converted calibration signal;
- measuring a power of the second adjusted up-converted calibration signal; and
- determining the predetermined proportion based on a ratio between the power of the second adjusted up-converted calibration signal and the power of the first up-converted calibration signal.

16. The method of claim 15, wherein the calibration signal comprises a predetermined periodic signal.

17. The method of claim 8, wherein the test signal comprises a noise signal generated by a calibrated noise source.

18. An integrated circuit device comprising:
- an active RF receiver element configured to process a radio frequency (RF) signal to generate a receiver signal;
- an up-conversion mixer configured to up-convert a test signal to generate an RF test signal;
- a local oscillator circuit configured to generate an LO signal that is used to up-convert the test signal and down-convert the RF signal;
- a first power sensor configured to measure a power of the test signal to determine a first noise power;
- a second power sensor configured to measure a power of the RF test signal to determine a second noise power;
- a coupler configured to couple the RF test signal to an input of the active RF receiver element; and
- a third power sensor configured to measure a power of the receiver signal to determine a third noise power.

19. A method to determine a noise characteristic for an integrated circuit device comprising an active RF receiver element, the method comprising:
- receiving a test signal;
- measuring a power of the test signal to determine a first noise power;
- up-converting the test signal to generate an RF test signal;
- measuring a power of the RF test signal to determine a second noise power;
- coupling the RF test signal to an input of the active RF receiver element;
- measuring a power of a signal generated by the active RF receiver element to determine a third noise power; and
- determining the noise characteristic based on the first noise power, the second noise power, and the third noise power.

20. The method of claim 19, further comprising determining a gain of the active RF receiver element based on a ratio of the third noise power and the second noise power.

21. The method of claim 20, further comprising:
- removing the test signal from an up-conversion mixer that up-converts the test signal;
- measuring the signal generated by the active RF receiver element to determine a noise measurement; and
- determining the noise characteristic based on the noise measurement.

22. The method of claim 21, comprising determining the noise characteristic based on the noise measurement divided by a product of a standard noise temperature and the gain of the active RF receiver element.

* * * * *